United States Patent
Zentai et al.

(10) Patent No.: US 7,151,006 B2
(45) Date of Patent: Dec. 19, 2006

(54) PROCESS TO REDUCE THE DARK CURRENT IN SEMICONDUCTING FILMS

(75) Inventors: George Zentai, Mountain View, CA (US); Larry D. Partain, Los Altos, CA (US); Raisa Pavlyunchkova, Palo Alto, CA (US); Kanai S. Shah, Newton, MA (US); Paul R. Bennett, Acton, MA (US)

(73) Assignees: Varian Medical Systems Technologies, Inc., Palo Alto, CA (US); Radiation Monitoring Devices, Inc., Watertown, MA (US)

( * ) Notice: Subject to any disclaimer, the term of this patent is extended or adjusted under 35 U.S.C. 154(b) by 0 days.

(21) Appl. No.: 10/701,724

(22) Filed: Nov. 4, 2003

(65) Prior Publication Data

US 2005/0092925 A1 May 5, 2005

(51) Int. Cl.
*H01L 21/00* (2006.01)
*H01L 27/14* (2006.01)

(52) U.S. Cl. .................. 438/22; 438/24; 438/48; 438/56; 257/414; 257/431

(58) Field of Classification Search ............ 438/22, 438/24, 48, 56, 106; 257/414, 431
See application file for complete search history.

(56) References Cited

U.S. PATENT DOCUMENTS

| | | | |
|---|---|---|---|
| 5,563,421 A | 10/1996 | Lee et al. | |
| 5,648,660 A | 7/1997 | Lee et al. | |
| 5,652,430 A | 7/1997 | Lee | |
| 5,892,227 A | 4/1999 | Schieber et al. | |
| 6,326,625 B1 | 12/2001 | Zur | |
| 6,559,449 B1 * | 5/2003 | Ikeda et al. | 250/361 R |
| 2003/0010923 A1 | 1/2003 | Zur | |
| 2005/0079659 A1 * | 4/2005 | Duan et al. | 438/197 |
| 2005/0148179 A1 * | 7/2005 | Hirai et al. | 438/689 |

* cited by examiner

*Primary Examiner*—Hsien-Ming Lee
(74) *Attorney, Agent, or Firm*—Blakely, Sokoloff, Taylor & Zafman LLP

(57) ABSTRACT

A method of coating the joined crystals within a semiconductor conversion layer to reduce the dark current without compromising the sensitivity of the conversion layer is presented. A semiconductor conversion layer comprising a plurality of joined crystals and permeated by a polymer material and having microscopic voids is also presented.

43 Claims, 6 Drawing Sheets

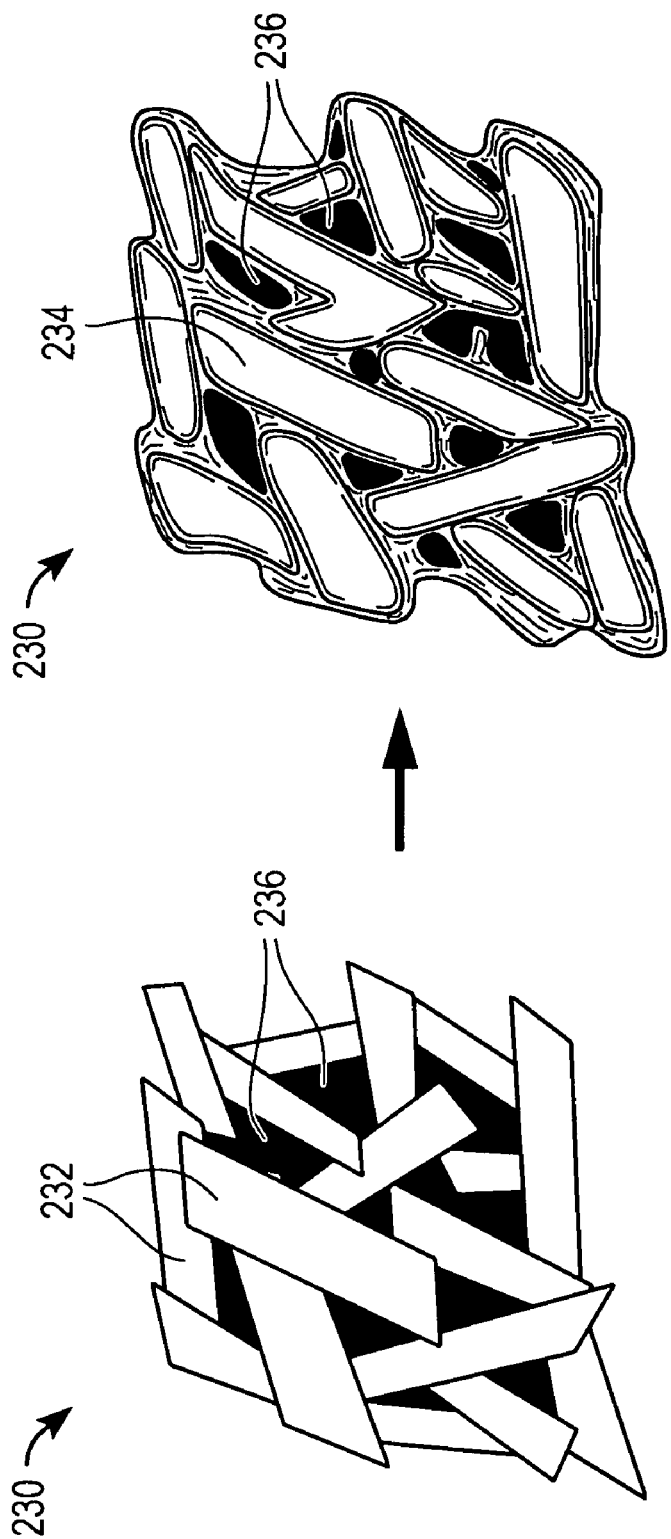

PROCESS TO REDUCE THE DARK CURRENT IN SEMICONDUCTING FILMS

TECHNICAL FIELD

The present invention relates to the field of flat panel x-ray imagers, and more particularly to the field of reducing the dark current of semiconductor conversion layers.

BACKGROUND

A thin-film x-ray imager is typically constructed by first forming a TFT (thin film transistor) array 160 on a substrate 170. A conductive layer 120 is then deposited on the substrate to form charge-collecting electrodes 125. Above the charge collecting electrodes 125 the semiconductor layer 110 is formed. In one prior art method, the semiconductor layer 110 is a composite material that is formed by combining a powder of loose polycrystalline semiconductor material with an organic binder. The polycrystalline semiconductor material can be amorphous selenium, lead oxide, polycrystalline silicon, thallium bromide, cadmium telluride, cadmium sulfide, mercuric iodide, and lead iodide. One prior method of forming the semiconductor layer 110 is by spraying or painting the organic binder on a purified polycrystalline semiconductor powder that has not yet been combined with any other material. Another prior art method of forming the semiconductor layer 110 is by forming a slurry of a polycrystalline semiconductor powder and an organic binder and then depositing this material on a substrate. The organic binder can be a polymer having a long chemical chain such as polyvinyl acrylate. The binder fills in all voids between the many crystals of the polycrystalline semiconductor powder. In the prior art, after the semiconductor layer 110 has been formed, an insulator layer 150 can be deposited above the semiconductor layer 110 to form a discreet insulator layer 150 that does not permeate the semiconductor layer 110. Above the semiconductor layer 110 the bias electrode 130 is formed by depositing a conductive material.

In use, a positive or negative bias voltage is applied to the electrode layer 130 relative to electrodes 125. When x-ray radiation 140 is made incident on the bias electrode 130 and then through the semiconductor material 110, electron-hole pairs form and drift apart within the semiconductor material 110 under the influence of the bias voltage across that region. If voltage is being continuously applied across the semiconductor layer 110, the electrons and holes will tend to separate, thereby creating a current flowing through the semiconductor layer 110. The magnitude of the current produced in the semiconductor layer 110 is related to the magnitude of the incident x-ray radiation 140 received. The current is collected, amplified and quantified to a digital code for a corresponding pixel. After removal of the incident x-ray radiation 140, the charges (electrons and holes) remain for a finite period of time until they can be recombined. When no radiation is present, a small current referred to as a "dark" current can be measured. Dark current is a problem, even in small quantities, because it can lead to a distortion of the values actually measured. This is because there is a linear contribution by the dark current to the measurement of the current flowing through the semiconductor material during the integration time. A significant amount of dark current could distort the end value measured for the pixel currents.

SUMMARY OF AN EMBODIMENT OF THE INVENTION

A structure and a method for the reduction of the dark current in a semiconductor conversion layer of a flat panel x-ray imager, without also reducing the sensitivity of the semiconductor conversion layer, are described. In one embodiment, the structure is a semiconductor conversion layer comprising a plurality of joined crystals, a polymer material within the semiconductor conversion layer, and a plurality of voids within the semiconductor conversion layer. In one embodiment, the method of forming such a structure includes providing a semiconductor conversion layer comprising a plurality of joined semiconductor crystals and permeating a polymer solution into the semiconductor conversion layer to coat the joined semiconductor crystals.

Other features and advantages of the present invention will be apparent from the accompanying drawings, and from the detailed description, which follows below.

BRIEF DESCRIPTION OF THE DRAWINGS

The present invention is illustrated by way of example and not intended to be limited by the figures of the accompanying drawings in which:

FIG. 2c is an illustration of a cross-sectional view of a portion of a polycrystalline lead iodide conversion layer before a polymer material is permeated into the layer to coat the crystal platelets.

FIG. 2d is an illustration of a cross-sectional view of a portion of a polycrystalline lead iodide conversion layer after a polymer material is permeated into the layer to coat the crystal platelets.

DETAILED DESCRIPTION

Described herein are methods and structures for the reduction of the dark current in post-deposition semiconductor conversion layers of photodetectors without also reducing the sensitivity of the post-deposition semiconductor conversion layer. In the following description, numerous specific details are set forth such as examples of specific components, processes, etc. in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

The terms "top," "bottom," "front," "back," "above," "below," and "between" as used herein refer to a relative position of one layer or component with respect to another. As such, one layer deposited or disposed above or below another layer, or between layers, may be directly in contact with the other layer(s) or may have one or more intervening layers. The term "coupled" as used herein means connected directly to or connected indirectly through one or more intervening layers or operatively coupled through non-physical connection (e.g. optically.)

Figure 1:
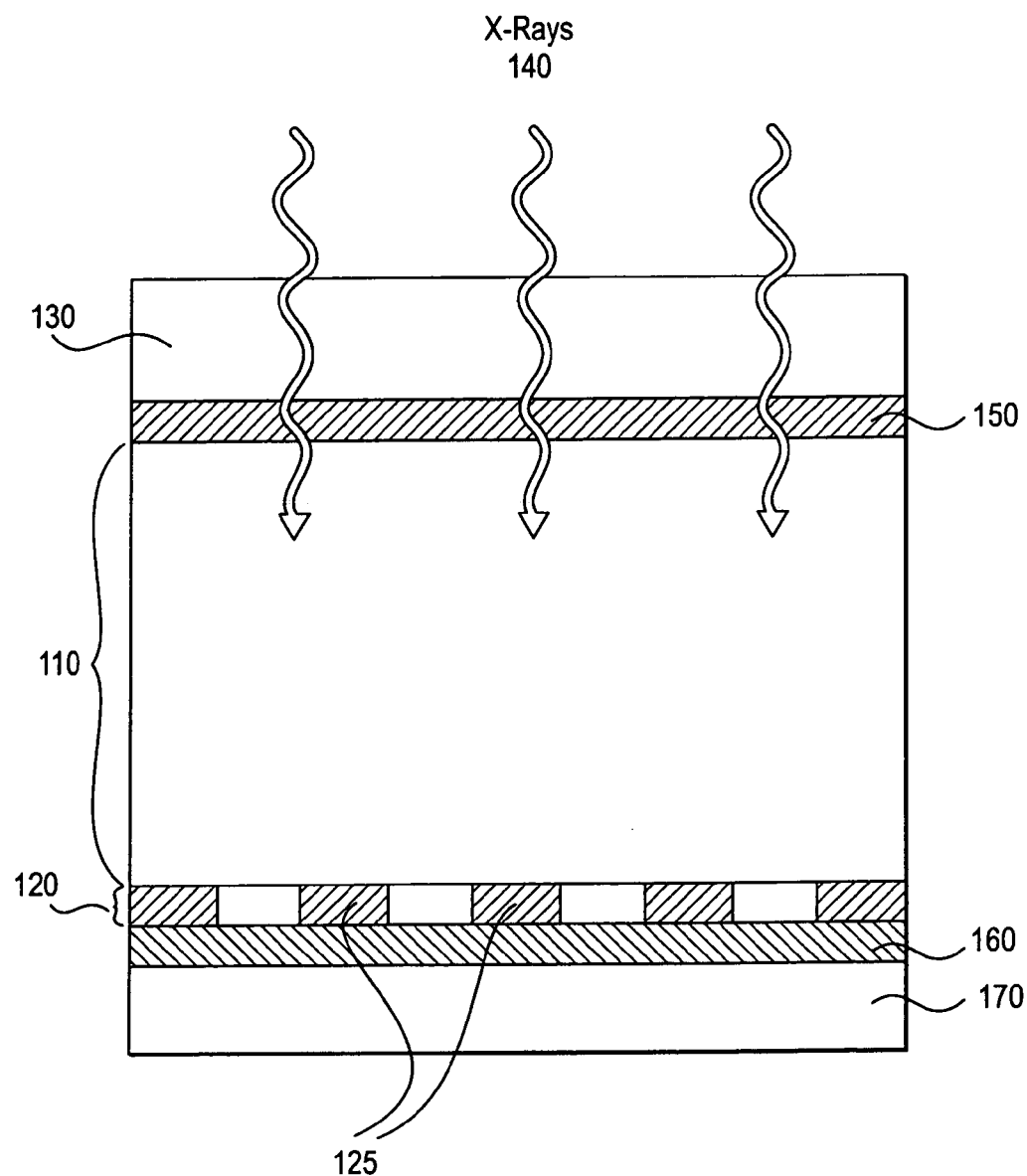
FIG. 1 is an illustration of a cross-sectional view of an x-ray imager including a semiconductor conversion layer.
Figure 2A:
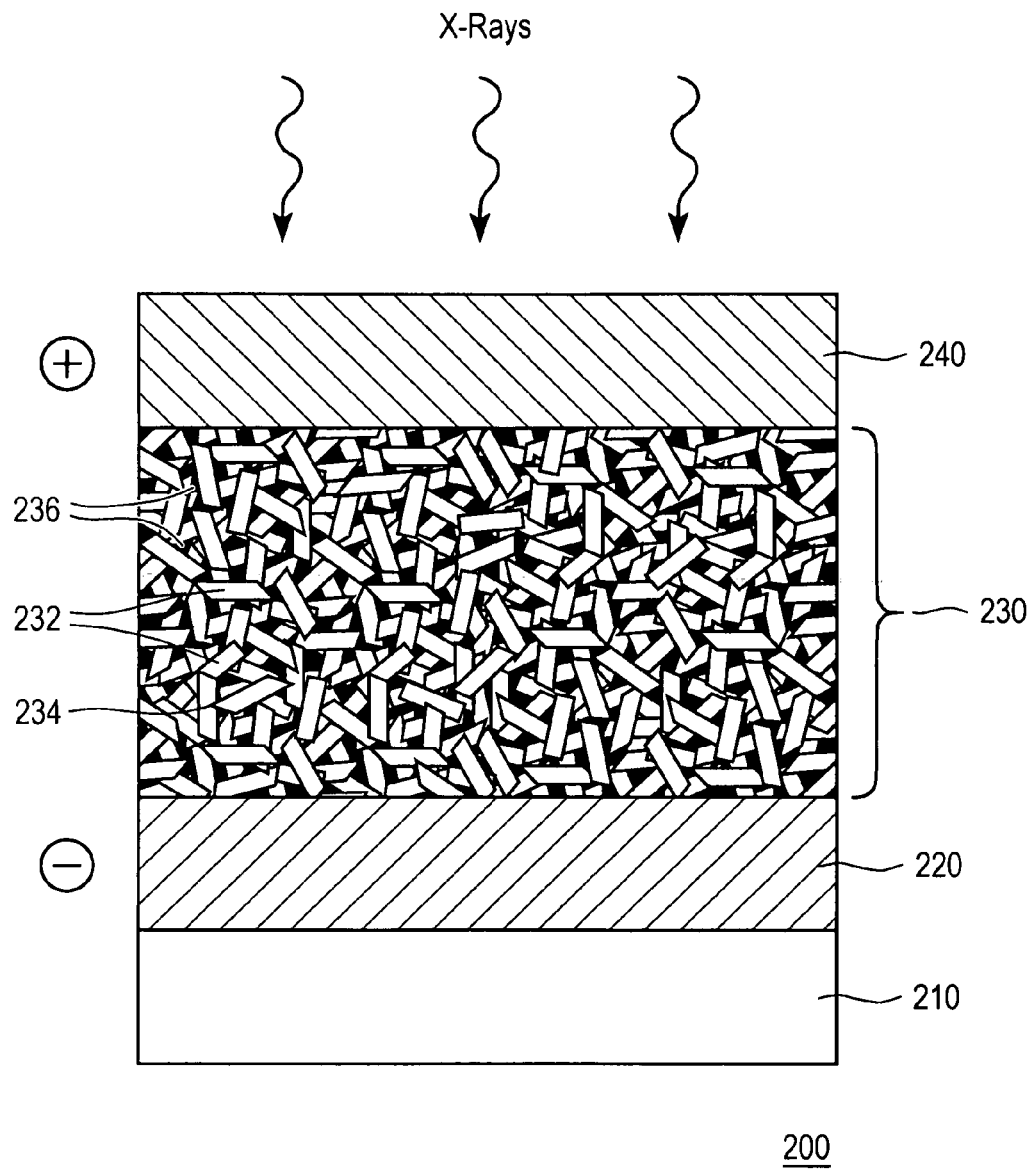
FIG. 2a is an illustration of a photodetector having a semiconductor conversion layer according to an embodiment.

A semiconductor conversion layer of joined crystals and a polymer material permeating the semiconductor conversion layer and coating at least a portion of the joined crystals is presented. Permeating, as used herein, means that the polymer contacts at least a portion of the crystal junctions within the semiconductor conversion layer. Additionally, or alternatively, the polymer may permeate in to a portion of the crystals of the semiconductor conversion layer. This conversion layer may also have many microscopic voids. This semiconductor conversion layer may be part of a photodetector in a flat panel x-ray imager. As illustrated in FIG. 2a, a photodetector may have a substrate 210 above which there is a first conductive layer 220 that can be patterned into charge collection electrodes. Above the first conductive layer 220 there is a semiconductor conversion layer 230 comprising crystals 232 that are joined together and are coated within the layer by a permeated polymer material 234. This semiconductor conversion layer 230 is a post-deposition layer because it has already been processed to form a continuous material where the individual crystals 232 within the conversion layer 230 have been joined together in some way. Examples of how the crystals 232 are joined within a post-deposition conversion layer 230 include sintering (heating to join crystals without melting them) or through a binder material. The polymer material 234 preferably covers as much surface area of the joined crystals 232 as possible. In one embodiment, the polymer material 234 is an acrylic polymer. There are voids 236 in between the polymer 234 covered crystals 232 within the semiconductor conversion layer 230. Above the semiconductor conversion layer 230 there is a second conductive layer 240 that serves as a bias electrode that will provide an electric field across the semiconductor conversion layer 230. In an alternative embodiment there may be an insulator layer (not shown) between the semiconductor conversion layer 230 and the second conductive layer 240.

Figure 2B:
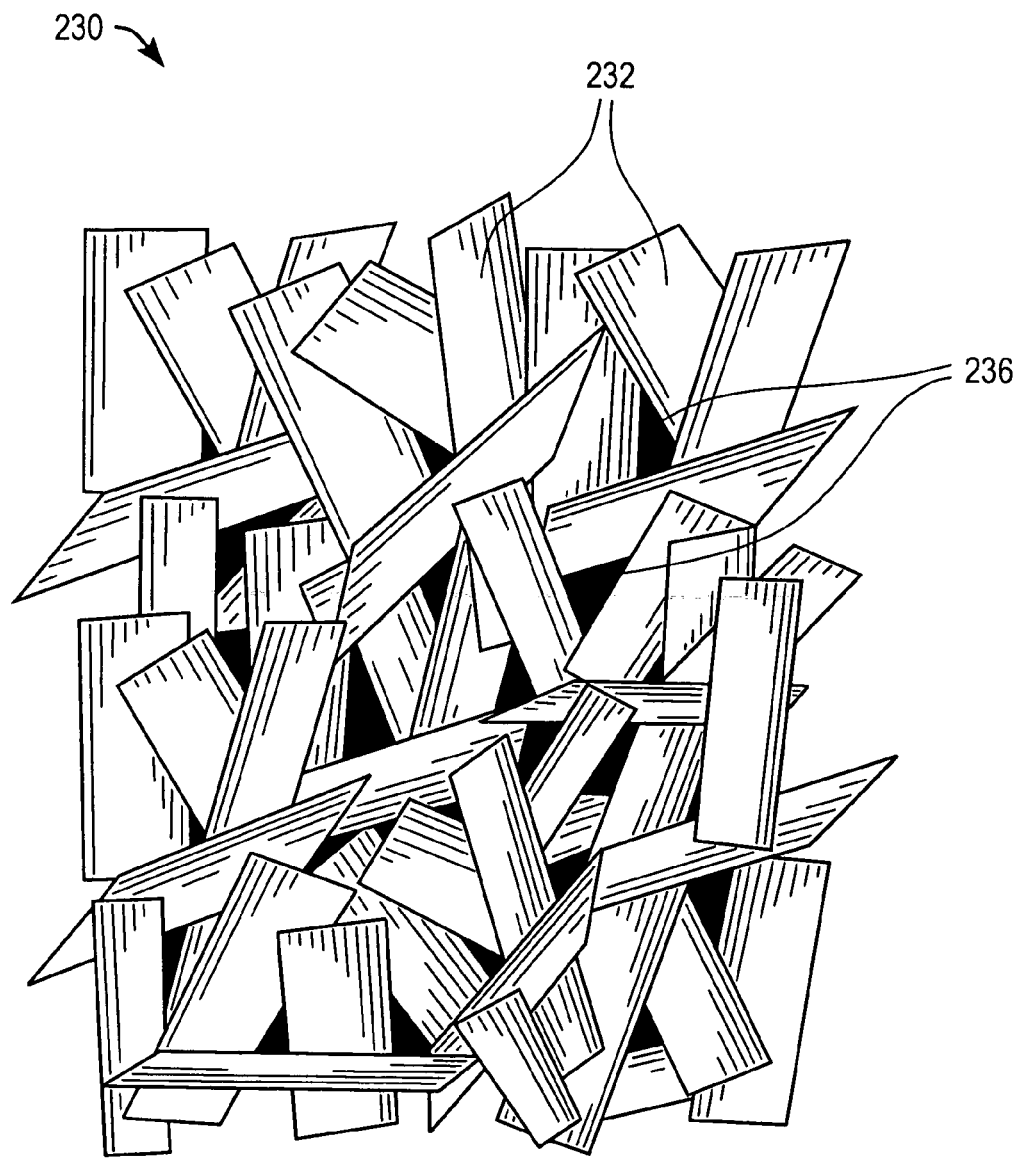
FIG. 2b is an illustration of a cross-sectional view of a polycrystalline lead iodide conversion layer.

The semiconductor conversion layer 230 can be any semiconductor material that will convert incident x-ray radiation to an electric current. Semiconductor materials are those that convert incident x-ray radiation to an electric current and include, for example, lead iodide ($PbI_2$) mercuric iodide ($HgI_2$), and polycrystalline bismuth triodide. These compounds may be used for semiconductor conversion layer 230 because they have a much higher mobility product than other semiconductors, such as selenium. The foregoing materials are provided by way of example as they represent materials used as photoconductors. It will be appreciated that other semiconducting materials or other materials may be used. Any material that satisfies the desired electrical parameters may be used. Semiconductor conversion layer 230 may be constructed of small, loosely joined crystals 232 that are generally flat "platelets" that do not naturally form a highly dense structure. A cross sectional view of a polycrystalline conversion layer 230 is illustrated in FIG. 2b. The crystal platelets 232 are loosely joined within the conversion layer 230 so that the conversion layer 230 has a large number of interior surfaces on the crystal platelets 232. Because of this large number of interior surfaces on the crystal platelets 232, the conduction effects that typically can be associated with semiconductor surfaces are taking place throughout the volume of the semiconductor conversion layer 230 and contribute to dark current. A conversion layer 230 may have a density in the approximate range of 80–50% of the density of bulk solid crystalline lead iodide. In alternate embodiments the density of the conversion layer 230 may be less than 50% or greater than 80% of the density of bulk solid crystal lead iodide. There are microscopic voids 236 within the conversion layer 230 that may be filled with air, leading to the lower density of the polycrystalline conversion layer 230.

These microscopic voids 236 and the conduction effects of the interior surface areas of the crystal platelets 232 are thought to contribute to the dark current of the semiconductor conversion layer 230. Dark current is a problem, even in small quantities, because it can lead to a distortion of the values actually measured. This is because there is a linear contribution by the dark current to the measurement of the x-ray radiation during the integration time. If there is a significant amount of dark current during the integration time of a measurement of the x-rays, that dark current could distort the end value measured for the x-rays. The dark current of a polycrystalline semiconductor conversion layer 230 is reduced by permeating a polymer material 234 into the semiconductor conversion layer 230 and coating at least a portion of the joined crystals 232 within the semiconductor conversion layer 230 with the polymer material 234. FIG. 2c illustrates an expanded view of a portion of a polycrystalline semiconductor conversion layer 230 before it is coated with a polymer material 234. The conversion layer 230 comprises joined crystals 232, that can be, for example, lead iodide or mercuric iodide platelets, and air filled voids 236. In other embodiments the joined crystals may be other types of semiconductor materials. FIG. 2d illustrates the same portion of semiconductor conversion layer 230 after it is coated with the polymer material 234. In FIG. 2d, the joined crystals 232 within the semiconductor conversion layer 230 have been coated with the polymer material 234. The polymer material 234 coats the crystals 232 within the semiconductor conversion layer 230 and does not fill all of the microscopic voids 236. The polymer material 234 will provide passivation of the crystal surfaces of the interior and exterior of the semiconductor conversion layer 230 where most of the dark current occurs. Additionally, the air filled voids 236 will provide insulation of the conductive effects on the interior surfaces of the joined crystals 232.

A semiconductor conversion layer 230 typically will have a thickness in the approximate range of 50 and 500 μm. In an alternate embodiment, the conversion layer 230 may have a thickness less than 50 μm or greater than 500 μm. A polycrystalline semiconductor conversion layer 230 can have a density that is approximately 80% or less of the density of a bulk solid crystal semiconductor layer, and may have a density in the approximate range of 80% to 50% of the density of a bulk solid crystal semiconductor layer. In an embodiment, the semiconductor conversion layer 230 can be polycrystalline lead iodide having a density that is around 50% of 6.2 g/cm$^3$ (grams per cubic centimeter), the density of bulk solid crystal lead iodide. In alternate embodiments the conversion layer 230 can have a density of less than 50% or greater than 80% of the density of bulk solid crystal semiconductor material. The reduction of dark current of the semiconductor conversion layer 230 depends on the percentage of the joined crystals 232 within the semiconductor conversion layer 230 that is coated with the polymer material 234. The density of the semiconductor conversion layer 236 is one of the factors affecting the percentage of the joined crystals 232 within the semiconductor conversion layer 230 that is coated with the polymer material 234. In less dense films, a greater percentage of the interior surfaces are coated because there are more air filled voids 236 into which the polymer material 234 can flow. For example, a polycrystalline lead iodide conversion layer that is treated with an acrylic polymer material has been shown to reduce the dark current in the approximate range of 2–100 times the original value for the dark current before the acrylic polymer is applied. Lead iodide without the acrylic polymer material may have a dark current of up to 100 pA/mm$^2$ (picoamperes per square millimeter), depending on its density. With the acrylic polymer material, the dark current of lead iodide may be reduced to, for example, in the approximate range of 10 pA/mm$^2$ to 20 pA/mm$^2$, or even approximately below 1 pA/mm$^2$. Mercuric iodide has somewhat similar chemical structure to lead iodide and, thus, a polymer material 234 coating the joined crystals 232 within a mercuric iodide conversion layer may have the same effects of reducing dark current as in post-deposition lead iodide.

The polymer material 234 can be any type of polymer that is soluble in solvents. The polymer material may also be a mixture of more than one type of polymer. The polymer material 234 can also be chosen based on the dielectric constant of the semiconductor conversion layer 230. In an embodiment, the dielectric constant of the polymer material 234 is approximately the same as the dielectric constant of the semiconductor conversion layer 230. For example, if the semiconductor conversion layer 230 is polycrystalline lead iodide, the polymer material 234 may have a dielectric constant of around 20, and if the semiconductor conversion layer 230 is polycrystalline mercuric iodide the polymer material 234 may have a dielectric constant of around 10. In one embodiment, the polymer material 234 is a "Humiseal" acrylic polymer sold by the Humiseal Division of Chase Corporation (Woodside, N.Y.) The Humiseal acrylic polymers typically have a dielectric constant of around 5.

In addition to reducing the dark current of a semiconductor conversion layer 230, the polymer material 234 may have other advantages. One such advantage is that the polymer material 234 may serve as an anti-corrosion layer between the semiconductor conversion layer 230 and the conductive layers 240 and 220 of a photodetector 200 in the embodiments where the polymer material 234 is deposited prior to the deposition of the conductive layers 240 or after the deposition of the conductive layer 220 but before the deposition of the semiconductor conversion layer 230. This would be valuable when mercuric iodide is used as the semiconductor conversion layer 230 because it is known that mercuric iodide is corrosive towards most conductive layers such as 240 and 220. Another advantage of the polymer material 234 is that it may improve the adhesion between the semiconductor conversion layer 230 and the conductive layers 240 and 220 of a photodetector 200.

Figure 3:
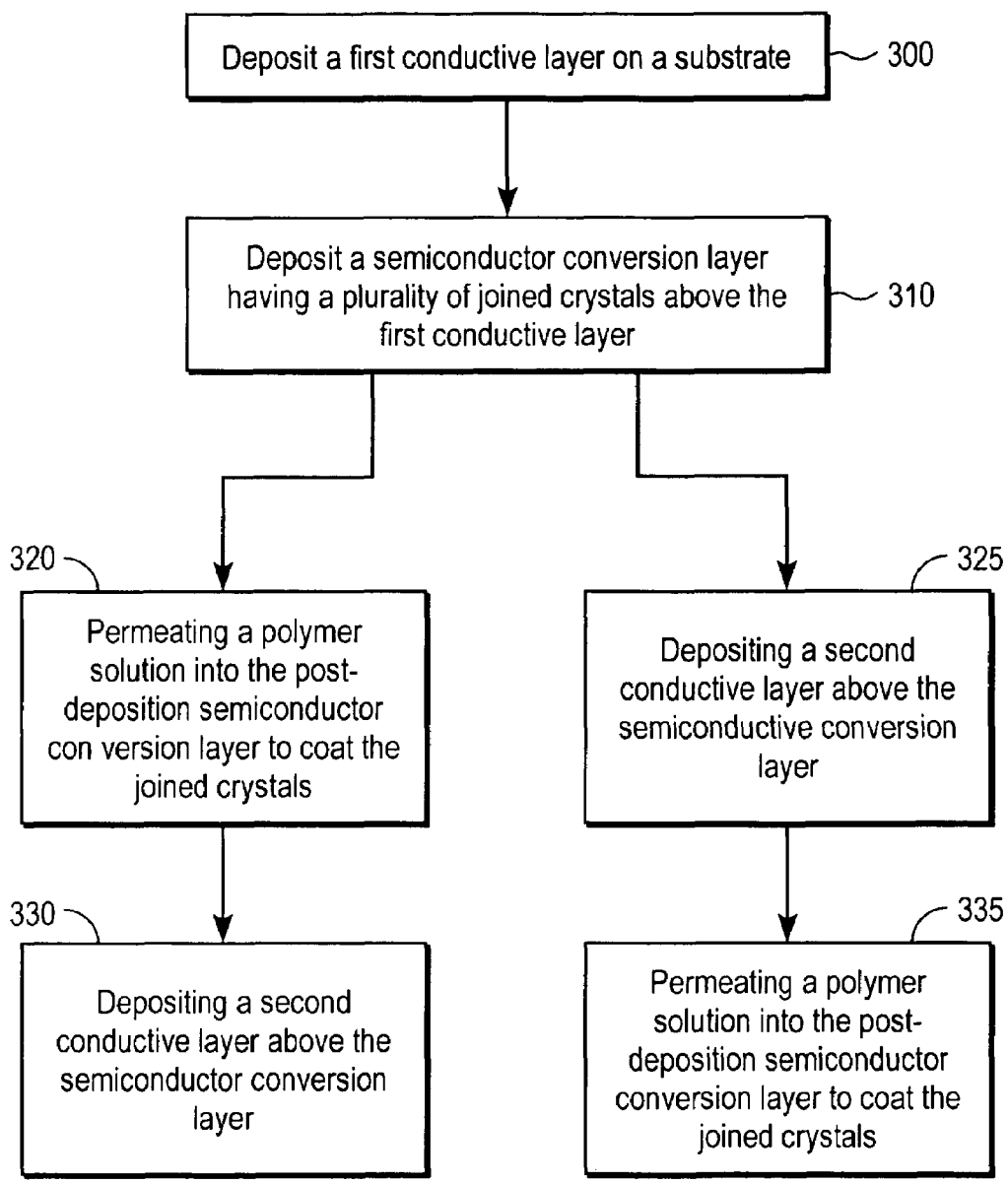
FIG. 3 is a block diagram of a process of forming a photodetector including permeating a polymer material into a semiconductor conversion layer to coat the crystal platelets.

FIG. 3 is a block diagram describing a method of constructing a photodetector 200 for flat screen x-ray imager. At block 300, a first conductive material is deposited on a substrate 210 to form an electrode 220. The electrode 220 may be deposited by evaporation, but it may also be deposited by most other deposition methods known in the art including chemical vapor deposition, electrodeposition, and atomic layer deposition. The electrode 220 can be any type of metal, for example, aluminum, copper, silver, gold and palladium. At block 310, a semiconductor conversion layer 230 having a plurality of joined crystals 232 is deposited above the first conductive material that forms electrode 220 by methods well known in the art. The semiconductor conversion layer 230 is then permeated with a polymer solution at block 320. The block diagram in FIG. 4 describes the process of permeating the semiconductor conversion layer 230, including the joined crystals 232 within the semiconductor conversion layer 230, with the polymer solution in greater detail.

Figure 4:
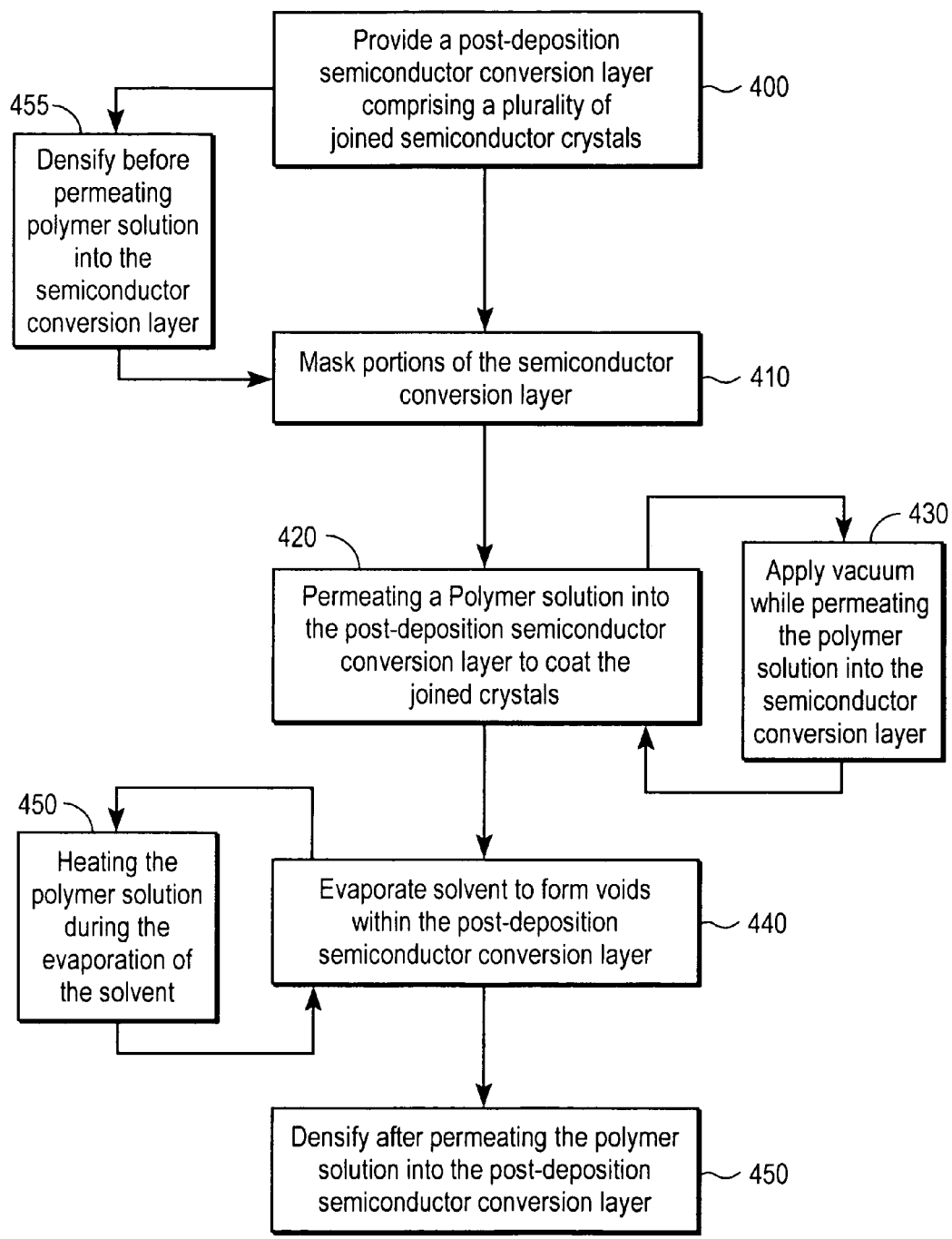
FIG. 4 is a block diagram of a process of forming a semiconductor conversion layer including permeating a polymer material into the layer.

At block 400, of FIG. 4, a semiconductor conversion layer 230 having a plurality of joined crystals 232 is provided. In one embodiment, as described at block 410, the semiconductor conversion layer 230 is masked before it is permeated with a polymer solution to coat at least a portion of the joined crystals 232. The masking can be done using any type of removable substance that would not be corroded by the polymer solution, and more particularly by the solvent in the polymer solution. In one embodiment, a masking tape such as "Humitape" from the Humiseal Division of Chase Corporation is used. In another embodiment, the removable substance may be a fluid that hardens after it is applied to the semiconductor conversion layer 230. The portions of the semiconductor conversion layer 230 that are masked are bonding pad areas on an imager array that create conductive contacts to the conductive layers that serve as electrodes 220 and 240 in a photodetector 200. These bonding pad areas are masked because the polymer material will prevent good electrical connections to and from the photodetector 200.

The polymer solution is then permeated into the semiconductor conversion layer 230 to coat the joined crystals 232 at block 420. The polymer solution used to coat the semiconductor conversion layer 230 may be a polymer material 234 and a solvent (also called a thinner.) The choice of solvent used in the polymer solution is based on the polymer material 234 that needs to be solvated. There may even be more than one solvent used to form the polymer solution. The ratio of polymer material 234 to solvent is based on how viscous a polymer solution is desired. A viscosity that is thick enough to sufficiently cover the exterior and interior surfaces of the joined crystals 232 of a semiconductor conversion layer 230 is needed, but it should not be so thick that it cannot permeate into the air filled voids 236 of the semiconductor conversion layer 230 to coat at least a portion of the joined crystals 232. The amount of air filled voids 236 of the semiconductor conversion layer 230 into which the polymer solution can permeate can be increased by thinning the polymer solution with a solvent so that the polymer solution will flow more easily. A thinner polymer solution will leave more void space, so that the correct mixture ratios are valuable to the process. Alternatively or in combination with thinning the polymer solution, vacuum can be used to empty the air from the gaps to obtain a better permeation of the polymer into the voids.

In one embodiment the polymer material 234 is a "Humiseal" acrylic coating sold by the Humiseal Division of Chase Corporation (Woodside, N.Y.) and the solvent can be either the Humiseal thinner type 503, that is a mixture of toluene and methyl ethyl ketone, or the Humiseal thinner type 521, that is a mixture of xylene, ethyl benzene, and toluene. The Humiseal acrylic coating typically has a formulation including between 47–62% toluene, 13–29% methyl ethyl ketone, 19–38% acrylic polymer, 0–8% vinyl polymer, and 0–1% optical brightener. The ratio of Humiseal acrylic polymer to either of the Humiseal thinners can be in the approximate range of between 1:5 and 1:20. After permeating the polymer solution into the semiconductor conversion layer 230 to coat at least a portion of the joined crystals 232, the solvents from the Humiseal and the thinner will evaporate to leave only the acrylic, polymer, and the vinyl polymer if it is present, on the film. The Humiseal acrylic polymer will coat both the interior and exterior surfaces of the joined crystals 232 of the semiconductor conversion layer 230. An approximate range of 80%–90% of the Humiseal acrylic polymer and thinner polymer solution will evaporate. In alternate embodiments, the amount of the solution that evaporates may be greater than 90% or less than 80%.

The polymer solution can be permeated into the semiconductor conversion layer 230 to coat the joined crystals 232 by several different methods, for example, dip coating, spin coating, painting, spraying, and chemical vapor deposition. In one embodiment, the semiconductor conversion layer 230 is submerged in a bath of the polymer solution for a period of time sufficient to permeate the semiconductor conversion layer 230 and to coat the joined crystals 232 within the conversion layer 230. The semiconductor conversion layer may or may not have conductive layer 240 formed above it when submerged in the bath. For example, where the bath of the polymer solution is a mixture of thinner and the Humiseal acrylic polymer formulation having a 1:20 ratio, the time that the substrate with a semiconductor conversion layer 230 having dimensions of up to approximately 10 cm (centimeters)×10 cm is submerged is 5 seconds. The amount of polymer solution that is prepared for the bath depends on the size and number of substrates that will be dipped in the bath. The amount is typically guided by the amount it will take to submerge a single substrate on which the semiconductor conversion layer 230 is formed because the substrates are usually dipped one at a time. The substrate can be dipped in the polymer solution bath at room temperature, or at any temperature in the approximate range of −1.1° C. and 82.2° C. In alternate embodiments, the temperature of the dipping may be greater than 180F or less than 30F. As described at block 436 of FIG. 4, vacuum can be applied to the chamber in which the semiconductor conversion layer 230 is being permeated with the polymer solution in order to increase the surface area of the joined crystals 232, both exterior and interior, that are coated by the polymer solution. The presence of the conductive layer above the semiconductor conversion layer does not change the parameters in this example.

After the substrate is removed from the bath, it is held vertically and excess fluid is allowed to run off. The solvent is then evaporated from the polymer solution at block 440. This can be done, for example, by laying the substrate with the semiconductor conversion layer 230 flat in a room temperature environment for a time sufficient to evaporate the solvent and leave a solid coating of polymer material 234 on at least a portion of the joined crystals 232 of the semiconductor conversion layer 230. Alternately, the evaporation of the solvent can be done by heating the polymer solution on the semiconductor conversion layer 230 at a temperature of up to approximately 125° C. for $PbI_2$, as described at block 450. Also, in either case, whether the evaporation is performed at room temperature or during heating, the evaporation may be performed under vacuum. After evaporation of the solvent from the polymer solution, only the polymer material 234 remains. The remaining polymer material 234 coats the exterior and interior surfaces of the joined crystals 232 of the semiconductor conversion layer 230 but generally does not fill the voids 236 within the semiconductor conversion layer 230. The resulting semiconductor conversion layer 230 may therefore be porous, having air filled voids 236. After the solvent has been evaporated and the coating has solidified, the substrate and the coating may tolerate any temperature in the approximate range of −65° C. and 125° C. In alternate embodiments the substrate may tolerate temperatures of less than −65° C. or greater than 125° C.

In yet another embodiment, at block 450 of FIG. 4, the semiconductor conversion layer 230 is densified by a cold isostatic pressing (CIP) process after the polymer solution is permeated into the conversion layer 230 to coat at least a portion of the joined crystals 232. A cold isostatic pressing process is one where a material, such as the conversion layer 230, is densified at or near room temperature with pressure being applied through a liquid (e.g. water or oil.) In one embodiment of the CIP process, the semiconductor conversion layer 230 will be enclosed in a non-rigid enclosure to protect the film from moisture and provide the medium through which the pressure is applied. The non-rigid enclosure is vacuum-sealed and then submerged in a liquid within a compression chamber where the isostatic pressing occurs. Examples of liquids used in this process may include water, hydraulic oil, and alcohol. This process may be used to densify the semiconductor conversion layer 230 to a density from the approximate range of 50% to 80% of the theoretical density of a bulk solid crystal semiconductor of 6.2 g/cc (grams per cubic centimeter) to 90% of the theoretical density of a bulk solid crystal semiconductor. In alternate embodiments the density of the densified conversion layer 230 can be less than approximately 50% or greater than approximately 80% of the density of a bulk solid crystal semiconductor. In an alternate embodiment, at block 455, the cold isostatic pressing process is performed before the polymer solution is permeated in to the semiconductor conversion layer 230. But, densifying the semiconductor conversion layer 230 after permeating the polymer may be advantageous when the initial density of the semiconductor conversion layer 230 is not sufficiently low for the polymer solution to properly permeate the conversion layer 230 and coat at least a portion of the joined crystals 232.

A second conductive layer is then deposited above the semiconductor conversion layer 230 at block 330 of FIG. 3 to form electrode 240. The second conductive layer would be deposited in a manner similar to the first conductive layer and can be the same conductive material as the first conductive layer. In an alternate embodiment, described at blocks 325 and 335 of FIG. 3, a second conductive layer is deposited above the semiconductor conversion layer 230 at block 325 prior to permeating the polymer solution into the conversion layer 230 to coat the joined crystals 232 at block 335. The polymer solution will still be able to permeate the surface of the semiconductor conversion layer 230 and coat the joined crystals 232 within the semiconductor conversion layer 230 even if the second conductive layer has been deposited first.

In the foregoing detailed description, the method and apparatus of the present invention has been described with reference to specific exemplary embodiments thereof. It will, however, be evident that various modifications and changes may be made thereto without departing from the broader spirit and scope of the present invention. In particular, the separate blocks of the various block diagrams represent function blocks for methods or apparatuses, and are not necessarily indicative of physical or logical separations or of an order of operation inherent in the spirit and scope of the present invention. The present specification and figures are accordingly to be regarded as illustrative rather than restrictive.

What is claimed is:

1. A method, comprising:
   providing a semiconductor conversion layer comprising a plurality of joined polycrystalline semiconductor crystals; and permeating a polymer solution into the semiconductor conversion layer to coat at least a portion of the joined polycrystalline semiconductor crystals.

2. The method of claim 1, wherein the semiconductor conversion layer is a polycrystalline lead iodide film.

3. The method of claim 2, wherein the polycrystalline lead iodide film has density that is approximately 50% of that of a bulk solid crystal lead iodide conversion layer.

4. The method of claim 1, wherein the semiconductor conversion layer is a polycrystalline mercuric iodide film.

5. The method of claim 1, wherein the semiconductor conversion layer is polycrystalline bismuth triodide.

6. The method of claim 1, wherein the polymer solution comprises a mixture of a polymer material and a solvent.

7. The method of claim 6, wherein the solvent is toluene.

8. The method of claim 6, wherein the polymer material comprises an acrylic polymer.

9. The method of claim 6, wherein the mixture of a polymer material and a solvent comprises a ratio of polymer material to solvent in the range of 1:5 to 1:20.

10. The method of claim 6, further comprising evaporating the solvent from the polymer solution that forms voids within the semiconductor conversion layer.

11. The method of claim 10, wherein evaporating the solvent further comprises maintaining the semiconductor conversion layer permeated with the polymer solution at room temperature.

12. The method of claim 10, wherein evaporating the solvent further comprises placing the semiconductor conversion layer permeated with the polymer solution under vacuum.

13. The method of claim 1, wherein the polymer solution comprises a mixture of a plurality of polymer materials and a solvent.

14. The method of claim 1, wherein permeating a polymer solution into the semiconductor conversion layer to coat the joined semiconductor crystals comprises submerging the semiconductor conversion layer in the polymer solution.

15. The method of claim 1, further comprising applying vacuum while permeating the semiconductor conversion layer with the polymer solution.

16. The method of claim 1, further comprising depositing the semiconductor conversion layer above a first conductive layer and wherein the first conductive layer is deposited above a substrate.

17. The method of claim 16, further comprising depositing a second conductive layer above the semiconductor conversion layer.

18. The method of claim 17, further comprising depositing the second conductive material above the semiconductor conversion layer after permeating the polymer solution into the semiconductor conversion layer.

19. A method, comprising:
providing a semiconductor conversion layer comprising a plurality of joined semiconductor crystals; and
permeating a polymer solution into the semiconductor conversion layer to coat at least a portion of the joined semiconductor crystals, wherein the semiconductor conversion layer has a density that is approximately 90% or less than that of a bulk solid crystal semiconductor material.

20. A method, comprising:
providing a semiconductor conversion layer comprising a plurality of joined semiconductor crystals;
permeating a polymer solution into the semiconductor conversion layer to coat at least a portion of the joined semiconductor crystals; and
evaporating the solvent from the polymer solution that forms voids within the semiconductor conversion layer, wherein evaporating the solvent further comprises heating the semiconductor conversion layer coated with the polymer solution at a temperature in the range of −1.11° C. to 82.2° C.

21. A method, comprising:
providing a semiconductor conversion layer comprising a plurality of joined semiconductor crystals; and
permeating a polymer solution into the semiconductor conversion layer to coat at least a portion of the joined semiconductor crystals, further comprising masking portions of the semiconductor conversion layer before permeating the polymer solution into the semiconductor conversion layer to coat the joined semiconductor crystals.

22. The method of claim 21, wherein the masking is done by coating the semiconductor conversion layer with a removable substance.

23. The method of claim 22, wherein the removable substance is a masking tape.

24. The method of claim 22, wherein the removable substance is a fluid that hardens after application to the semiconductor conversion layer.

25. A method, comprising:
providing a semiconductor conversion layer comprising a plurality of joined semiconductor crystals; and
permeating a polymer solution into the semiconductor conversion layer to coat at least a portion of the joined semiconductor crystals, further comprising densifying the semiconductor conversion layer.

26. The method of claim 25, wherein densifying the semiconductor conversion layer occurs before permeating the semiconductor conversion layer with the polymer solution.

27. The method of claim 25, wherein densifying the semiconductor conversion layer occurs after permeating the semiconductor conversion layer with the polymer solution.

28. The method of claim 25, wherein densifying the semiconductor conversion layer comprises:
enclosing the semiconductor conversion layer in a non-rigid enclosure;
submerging the semiconductor conversion layer in the non-rigid enclosure in a liquid within a compression chamber; and
pressing the semiconductor conversion layer in the non-rigid enclosure through the liquid in the compression chamber at approximately room temperature.

29. A method, comprising:
providing a semiconductor conversion layer comprising a plurality of joined semiconductor crystals;
permeating a polymer solution into the semiconductor conversion layer to coat at least a portion of the joined semiconductor crystals; and
depositing a second conductive material above the semiconductor conversion layer before permeating the polymer solution into the semiconductor conversion layer.

30. An apparatus, comprising:
a semiconductor conversion layer comprising a plurality of joined polycrystalline crystals and a plurality of voids within the semiconductor conversion layer;
a polymer material permeated within the semiconductor conversion layer and coating at least a portion of the plurality of joined polycrystalline crystals.

31. The apparatus of claim 30, wherein the polymer material is an acrylic.

32. The apparatus of claim 31, wherein the acrylic has a dielectric constant of approximately 5.

33. The apparatus of claim 30, wherein the semiconductor conversion layer has a first dielectric constant and the polymer material has a second dielectric constant that is approximately that of the first dielectric constant of the semiconductor conversion layer.

34. The apparatus of claim 30, wherein the polymer material has a dielectric constant in the range of 5 to 25.

35. The apparatus of claim 30, wherein the semiconductor conversion layer is polycrystalline lead iodide.

36. The apparatus of claim 30, wherein the semiconductor conversion layer is polycrystalline mercuric iodide.

37. The apparatus of claims 30, wherein the semiconductor conversion layer is polycrystalline bismuth triodide.

38. The apparatus of claim 30, wherein the semiconductor conversion layer is densified to approximately 90% of that of a bulk solid crystal semiconductor material.

39. The apparatus of claim 30, further comprising a first conductive layer on a first surface of the semiconductor conversion layer.

40. The apparatus of claim 30, further comprising a second conductive layer on a second surface of the semiconductor conversion layer.

41. An apparatus, comprising:

means for reducing a dark current of a polycrystalline semiconductor conversion layer using a polymer material permeated within the semiconductor conversion layer.

42. The apparatus of claim 41, wherein the semiconductor conversion layer comprises a plurality of joined crystals.

43. The apparatus of claim 41, wherein the semiconductor conversion layer has voids.

* * * * *